United States Patent [19]

Crass et al.

[11] Patent Number: 4,777,081
[45] Date of Patent: Oct. 11, 1988

[54] TRANSFER METALLIZING FILM

[75] Inventors: Guenther Crass, Taunusstein; Klaus Paschke, Bad Homburg; Lothar Bothe, Mainz, all of Fed. Rep. of Germany

[73] Assignee: Hoechst Aktiengesellschaft, Fed. Rep. of Germany

[21] Appl. No.: 775,329

[22] Filed: Sep. 12, 1985

[30] Foreign Application Priority Data

Sep. 19, 1984 [DE] Fed. Rep. of Germany ....... 3434298

[51] Int. Cl.⁴ ...................... B32B 27/32; C23C 14/00; C08J 5/18
[52] U.S. Cl. .................................... 428/215; 428/461; 428/476.9; 428/516; 428/330; 428/331; 428/451; 428/910; 428/464; 428/41; 264/176.1; 427/404
[58] Field of Search ............... 428/516, 215, 330, 331, 428/461, 451, 476.9

[56] References Cited

U.S. PATENT DOCUMENTS

| | | | |
|---|---|---|---|
| 4,560,614 | 12/1985 | Park | 428/516 |
| 4,567,089 | 1/1986 | Hattori et al. | 428/516 |
| 4,578,316 | 3/1986 | Clauson et al. | 428/516 |
| 4,599,275 | 7/1986 | Hayashi et al. | 428/461 |
| 4,604,322 | 8/1986 | Reid | 428/461 |

FOREIGN PATENT DOCUMENTS 0038878  4/1981  European Pat. Off. .

OTHER PUBLICATIONS

European Search Report.
Die Kunststoffe und Ihre Eigenschaften ("Synthetic Materials and Their Characteristics"), Dipl.-Ing. Hans Domininghaus.
Kunststoff Taschenbuch ("Synthetic Materials Handbook"), Begrundet von Dr. Franz Pabst.

Primary Examiner—P. C. Ives
Attorney, Agent, or Firm—Foley & Lardner, Schwartz, Jeffery, Schwaab, Mack, Blumenthal & Evans

[57] ABSTRACT

A biaxially oriented transfer metallizing film based on polypropylene, and process therefor. The film is a three-layer film produced by coextrusion and having a base layer of a propylene homopolymer and top layers applied to the two surfaces thereof. The base layer contains an additive depot of migrating monomers in an amount of 0.01 to 2.0 percent by weight, relative to the weight of the polymer constituting the base layer. The top layers are polypropylene that has a lower viscosity than the polypropylene of the base layer.

17 Claims, No Drawings

TRANSFER METALLIZING FILM

BACKGROUND OF THE INVENTION

The present invention relates to a biaxially oriented transfer metallizing film based on polypropylene.

For certain packaging purposes, there exists a high, continuously growing demand for composite materials of paper and metal, in particular aluminum foil. Although extremely thin metal foils are already being used for such composite materials and satisfactory results are achieved using these foils, attempts have been made to save even more of the scarce and costly metal by the use of metallized papers.

The state of the art has disclosed two different methods of metallizing paper. In accordance with the first method, the metal is deposited directly on the paper under high vacuum, whereas according to the second method, the metal is first vacuum-deposited on another substrate and then transferred to the paper. The second process is also referred to as transfer metallizing.

For the direct vacuum-metallizing of paper, the choice of an appropriate paper quality is a decisive factor; furthermore, an expensive preparation of the paper is required. This preparation comprises sealing the paper by means of a varnish layer or subjecting the paper to a drying step, during which the normal water content of paper, that is, about 6 to 7%, is reduced to about 3%. Following vacuum-metallizing, the paper has to be readjusted to its normal water content. These procedures involve high expenditures of cost and time.

For transfer metallizing, a plastic film, usually based on a polyolefin or polyester, is provided with a metal coating. The metallized film is coated with a contact adhesive and bonded to the paper to be metallized, which in this case is selected in accordance with the requirements of the intended use. After the curing of the contact adhesive, the plastic film is peeled off from the composite structure, with the metal layer remaining on the paper. The process of transfer metallizing can be performed economically only if the plastic film can be reused several times. Conventional prior art films can be reused only up to about six times, and thus, there is a need in the art for a plastic film which can be reused to a greater extent.

SUMMARY OF THE INVENTION

It is therefore an object of the instant invention to provide a film made of a thermoplastic polymer, which for reasons of economy can be reused as often as possible in the transfer metallizing of paper.

It is another object of the invention to provide a film, as above, which is multi-layered and biaxially oriented.

It is yet another object of the invention to provide a film, as above, in which the layers are coextruded.

It is yet another object of the invention to provide a process for preparing a metallizing film.

These objects are achieved by a biaxially oriented three-layer transfer metallizing film, comprising a propylene homopolymer base layer containing an additive depot of migrating monomers, the migrating monomers present in an amount of from about 0.01 to about 2.0% by weight relative to the weight of the propylene homopolymer, and a separate top layer applied on each side of the base layer, each top layer constructed of polypropylene having a viscosity lower than that of the base layer.

The objects of the invention are further achieved by a process for producing a biaxially oriented three-layer transfer metallizing film, comprising coextruding and biaxially orienting a propylene homopolymer base layer with top layers of polypropylene having a viscosity lower than that of the base layer, one of the top layers positioned on each side of the base layer, wherein the base layer contains an additive depot of migrating monomers, present in an amount of from about 0.01 to about 2.0% by weight relative to the weight of the propylene homopolymer.

DETAILED DESCRIPTION OF THE PREFERRED EMBODIMENTS

The invention provides for a transfer metalizing film of the type described above, which is characterized in that it is a three-layer film produced by co-extrusion. The film includes a base layer of propylene homopolymer and a top layer applied to each surface of the polypropylene. An additive depot of migrating monomers is contained in the base layer in an amount of 0.01 to 2.0 percent by weight, relative to the weight of the polymer forming the base layer. The top layers are made of a polypropylene having a lower viscosity than the polypropylene of the base layer.

The term "additive depot of migrating monomers" defines an admixture of additives in the base layer which includes compounds that, as a result of diffusive forces, are capable of gradually penetrating from the base layer into the top layers and of developing their action in the top layers. The additives contained in the base layer in particular include a combination of stearic acid amide and a hydroxyethylalkylamine possessing alkyl chains comprising 14 to 20 carbon atoms.

The quantity of additives contained in the base layer preferably amounts to between 0.01 and 1.0 percent by weight, in particular between 0.1 and 0.5 percent by weight, relative to the weight of the polypropylene forming the base layer.

The film according to this invention has a thickness ranging from 15 to 30 $\mu$m and preferably from 20 to 25 $\mu$m, whereby each of the top layers has a thickness of between 0.3 and 5 $\mu$m, preferably of between 0.5 and 1.5 $\mu$m.

Preferably, the top layers additionally contain inert admixtures which improve the slip properties or blocking resistance of the film. Admixtures of this kind include, for example, inorganic additives, such as calcium carbonate, barium sulfate, silicon dioxide, aluminum silicate and similar substances, or combinations thereof. Special preference is thereby given to pellet-shaped aluminum silicate of a particle diameter of 0.2 to 0.8 $\mu$m. This helps in particular to avoid the formation of scratches in the metal surface. Admixtures are contained in the top layers in amounts of 0.1 to 1.0 percent by weight, relative to the weight of the top layers. Thereby, preference is given to aluminum silicate, added in an amount of 0.2 to 0.6 percent by weight, relative to the weight of the top layers.

The viscosities of the polymers forming the base layer and the top layers, respectively, are indicated by means of their melt flow indices (MFI). The polymer of the base layer has a preferred MFI of 230/5 within a range of 5 to 20 g/10 min., and the polymer of the top layers has a preferred MFI of 230/5 within a range of 15 to 30 g/10 min., the viscosity of the polymer constituting the base layer being higher in each case than the viscosity of the polymer constituting the top layers.

The film according to the present invention offers the particular advantage that both of its surfaces can be used. After the vacuum-metallization of one of the film surfaces and transfer of the metal to the intended paper, the other surface of the film can be vacuum-metallized in a subsequent step, and so on. It has been found to be particularly advantageous in practical use to metallize the film on one side prior to the first transfer metallizing step, in order to avoid electrostatic charging during winding and then to perform transfer metallizing from the opposite side. Due to undesired electrostatic charges, discharge structures form on the film surface, which during the transfer metallizing are reproduced on the metal surface and lead to considerable quality reductions.

The metals for which the described film is suitable in particular include gold, silver, copper, nickel, tin and aluminum, and optionally also mixtures or alloys of at least two of these metals, aluminum being particularly suitable. The metals are usually deposited in layer thicknesses of 5 to 500 nm, depending on the type of support to which the metal layer is to be transferred. In general, the metal layers have thicknesses of 10 to 60 nm.

Processes by which the described metal layers can be applied are known and include, for example, vacuum deposition, steam phase plating, current-free plating and electroplating, and are employed alone or in combination. In industrial processes, vacuum deposition is particularly preferred.

EXAMPLE

A three-layer film comprising a base layer and two top layers was produced by coextrusion and biaxially oriented. The resulting film had a total thickness of 25 μm, the thicknes of the base layer being 23 μm and the thickness of each top layer being 1 μm. The base layer was a proplyene homopolymer having an MFI 230/5 of 12 g/10 min. and contained the following additives:

0.22% by weight of hydroxyethylalkylamine, with the alkyl group having 18 carbon atoms; and
0.25% by weight of stearic acid amide.

The two top layers each consisted of a polypropylene having an MFI 230/5 of 18 g/10 min., which additionally contained 0.4 percent by weight of aluminum silicate.

The three-layer film could be used 20 times without any difficulties, in the transfer metallizing of paper, which procedure could be carried out to achieve a consistent quality. Each time, the film was high-vacuum metallized with an aluminum layer having a thicknes of 40 nm.

It was only after repeating the treatment 20 times that small voids apeared during the transfer of the metal layer to the paper, which voids were caused by the depletion of the supply of additive in the base layer.

What is claimed is:

1. A biaxially oriented three-layer transfer metallizing film, comprising:
   a propylene homopolymer base layer containing an additive depot of migrating monomers, said migrating monomers (a) being present in an amount of from about 0.01 to about 2.0% by weight relative to the weight of said propylene homopolymer and (b) comprising a mixture of stearic acid amide and a hydroxyethylalkylamine that comprises an alkyl group containing 14 to 30 carbon atoms; and
   a separate top layer applied on each side of said base layer, each said top layer consisting essentially of polypropylene having a viscosity lower than that of said base layer, such that migrating monomers move from said base layer into at least one of said top layers.

2. A metallizing film as claimed in claim 1, wherein the quantity of said migrating monomers contained in the base layer is from about 0.01 to about 1.0 percent by weight of said propylene homopolymer.

3. A metallizing film as claimed in claim 1, wherein said film has a total thickness of from about 15 to about 30 μm.

4. A metallizing film as claimed in claim 1, wherein said top layers each have a thickness of from about 0.3 to about 5.0 μm.

5. A metallizing film as claimed in claim 1, wherein the polypropylene forming the base layer has a melt flow index 230/5 of from about 5 to about 20 g/10 min. and the polypropylene forming the top layers has a melt flow index 230/5 of from about 15 to about 30 g/10 min.

6. A metallizing film as claimed in claim 1, wherein said top layers contain an inert admixture which improves the slip properties or blocking resistance of the film, said admixture including compounds selected from the group consisting of calcium carbonate, barium sulfate, silicon dioxide and aluminum silicate, said admixture present in an amount of from 0.1 to 1.0 percent by weight, relative to the weight of the polymer constituting the top layers.

7. A metallizing film as claimed in claim 1, wherein the top layers contain aluminum silicate in an amount of from about 0.2 to about 0.6 percent by weight, relative to the weight of the polymer constituting the top layers.

8. A metallizing film as claimed in claim 1, wherein the quantity of said migrating monomers contained in the base layer is from about 0.1 to about 0.5 percent by weight of said propylene homopolymer.

9. A metallizing film as claimed in claim 1, wherein said film has a total thickness of from about 20 to about 25 μm.

10. A metallizing film as claimed in claim 1, wherein said top layers each have a thickness of from about 0.5 to about 1.5 μm.

11. A biaxially oriented transfer metallizing film, comprising:
   (a) a propylene homopolymer base layer;
   (b) at least one top layer applied over said base layer, said top layer consisting essentially of a propylene homopolymer and receiving a quantity of at least one migrating compound from said base layer;
   (c) an outer metal layer applied over said at least one top layer;
   (d) a first quantity of at least one compound capable of migrating from said base layer, said first quantity of migrating compound being contained in said top layer and being at least partially depleted from said top layer by transfer of said metal layer, said compound comprising a mixture of stearic acid amide and a hydroxyethylalkylamine that comprises an alkyl group containing 14 to 30 carbon atoms;
   (e) a second quantity of at least one migrating compound contained in said base layer, said second quantity being capable of migrating from said base layer to said top layer to replenish said first quantity upon transfer of said metal layer, said second quantity being comprised of a mixture of stearic acid amide and a hydroxyethylalkylamine that comprises an alkyl group containing 14 to 30 carbon atoms.

12. A metallizing film as claimed in claim 11, wherein said film includes an outer metal layer applied on both sides of said film.

13. A metallizing film as claimed in claim 11, wherein said film includes a said top layer on each side of said base layer, each said top layer having a viscosity lower than that of said base layer.

14. A metallizing film as claimed in claim 13, wherein said film includes an outer metal layer applied over each said top layer.

15. A metallizing film as claimed in claim 14, wherein each of said top layers contains a second quantity of migrating compound.

16. A metallizing film as claimed in claim 11, wherein said base layer contains a mixture of stearic acid amide and a hydroxyethylalkylamine having alkyl groups of from 14 to 30 carbon atoms, said mixture being present in an amount of from about 0.01 to about 2.0% by weight relative to the weight of said propylene homopolymer in said base layer.

17. A metallizing film as claimed in claim 11, wherein said at least one top layer includes an inert admixture for improving the slip properties or blocking resistance of said top layer.

* * * * *